United States Patent [19]
Schenkel et al.

[11] Patent Number: 5,307,145
[45] Date of Patent: Apr. 26, 1994

[54] PROCESS AND APPARATUS FOR MEASURING SMALL QUANTITIES OF LIGHT

[75] Inventors: Paul Schenkel, Watt; Beat Frick, Buchs, both of Switzerland

[73] Assignee: Gretag Imaging, AG, Althardstrasse, Switzerland

[21] Appl. No.: 928,729

[22] Filed: Aug. 13, 1992

[30] Foreign Application Priority Data

Aug. 26, 1991 [DE] Fed. Rep. of Germany ..... 91810681

[51] Int. Cl.$^5$ ............................................. G01J 1/44
[52] U.S. Cl. ................................. 356/215; 307/311; 250/214 A; 356/218
[58] Field of Search ............... 356/215, 216, 218; 250/214 R, 214 A; 307/311, 491; 328/162, 165

[56] References Cited

U.S. PATENT DOCUMENTS 4,666,301 5/1987 Gruenke ............................. 356/218

FOREIGN PATENT DOCUMENTS

| 0055027 | 6/1982 | European Pat. Off. . |
| 0075767 | 4/1983 | European Pat. Off. ............. 356/215 |
| 2446610 | 4/1976 | Fed. Rep. of Germany . |
| 40980 | 3/1980 | Japan ................................. 356/215 |
| WO90/06492 | 6/1990 | World Int. Prop. O. . |

*Primary Examiner*—Richard A. Rosenberger
*Attorney, Agent, or Firm*—Burns, Doane, Swecker & Mathis

[57] ABSTRACT

A light receiver converts light to be measured into an electrical signal, which during a measuring interval is integrated into a measuring signal. In a first time segment a first mean value signal is formed, corresponding to the mean value of the measuring signal over the first time segment. In a second time segment of equal duration, a second mean value signal is formed within the same measuring interval, corresponding to the mean value of the measuring signal over the second time segment. Finally a difference signal is formed corresponding to the difference of the two mean value signals and constituting a measure of the light received. The difference signal is passed on for further signal processing.

18 Claims, 3 Drawing Sheets

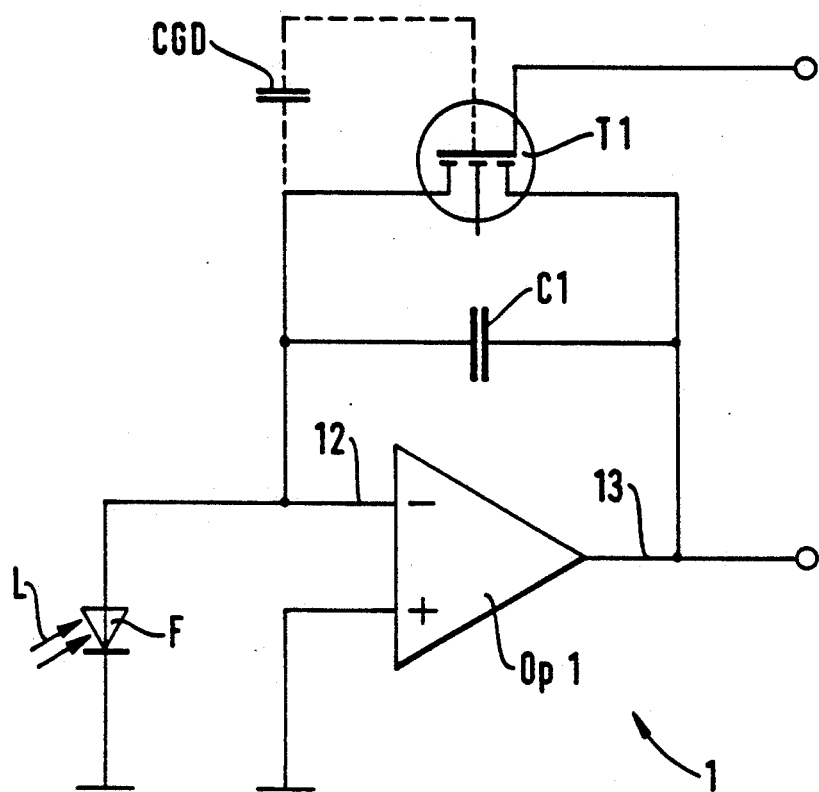
_Fig. 2_
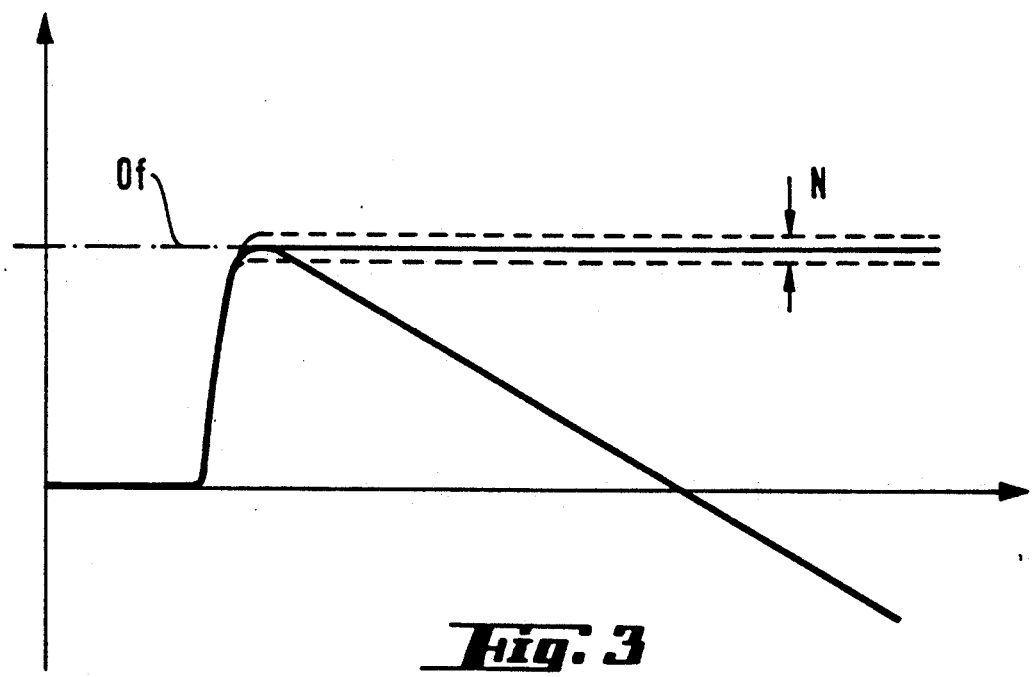
_Fig. 3_

PROCESS AND APPARATUS FOR MEASURING SMALL QUANTITIES OF LIGHT

BACKGROUND OF THE INVENTION

The invention relates to a process and an apparatus for the measurement of small quantities of light.

Processes and devices of this type are known and are used for example in photographic printers, wherein the copy master, consisting for example of positive or negative films, is measured in order to determine the quantities of copying light required for the subsequent exposure of the copy material, for example photographic paper. The films are measured for example in a manner such that the film is exposed in numerous individual measuring points with light, which penetrates the film to be measured. The light transmitted through the film is received and the transmissivity of the film determined by the quantity of light transmitted through each measuring point. The light quantities are usually determined with the aid of photodiodes which convert the light received into an electrical signal corresponding to the quantity of light received.

The trend in measuring copy masters (films) is toward increasingly higher resolutions of the master. In practice, this means that each individual image field is measured in more and more individual measuring points. This renders the quantity of light penetrating the film in the individual measuring points progressively smaller. Consequently, the electrical signal produced by the photodiode (photo current) will also be smaller. Additionally, the measuring intervals, i.e., the measuring times, wherein the individual measuring points are measured, are becoming shorter.

The amplification of the outlet signal by an operational amplifier (OpAmp circuit) which contains a resistance in its feedback loop, raises certain problems. An amplifier circuit of this type must be provided additionally with a capacitor parallel to the feedback resistance, so that the unavoidable capacitance of the photodiode (blocking layer capacitance, etc.) may be compensated, thereby avoiding the overshooting of the outlet signal of the amplifier circuit. Another reason for such a capacitor in the feedback loop is that in the finite amplification bandwidth of the operational amplifier, as in this manner, a defined frequency variation is produced over the bandwidth to be measured.

However, there is a disadvantage that the noise current caused by the resistance as a function of the size of the resistance and the signal bandwidth to be measured, is large enough so that in the case of acceptable signal amplifications (i.e., with a large feedback resistance) usable signal-noise ratios can no longer be obtained. Since the capacitance of the feedback capacitor must be maintained small, the response time of the OpAmp circuit can be affected only by the size of the feedback resistance. However, the response time must be very small as in the case of high resolutions of the master, numerous measuring points must be measured during a brief period of time and the outlet signal must be responding during this time. Consequently, the feedback resistance must be chosen as small as possible, which in turn renders the noise current generated by it large enough so that practically no usable signal-noise ratio may be obtained, or the measuring signal cannot even be recognized separately from the noise. Furthermore, this consideration does not even take into account the residual noise of the operational amplifier (OpAmp) itself, which is added to the resistance noise.

An amplifier circuit is thus proposed, which is not limited by the detrimental properties of such resistances. For this purpose, only one capacitor is provided in the feedback loop of the amplifier circuit. The outlet signal of this amplifier circuit (integrator) is then a measuring signal that is proportional not to the photo current, but to the time integral of it, i.e., proportional to the charge generated in the photodiode. However, at the onset of a measurement the capacitor must be discharged to create an initial condition that is independent from the previous history of the circuit in order to prevent any falsification of the measured result by residual energies remaining in the capacitor. This discharge of the capacitor is effected by means of a MOSFET switch. But due to the unavoidable switching capacities of such a MOSFET switch (Gate-Drain-capacitance, etc.) a charge is transported to the inlet of the amplifier circuit, causing a large offset at the outlet of the amplifier circuit. This offset is not the same in each switching process, i.e., there are certain fluctuations of the offset, and so-called switching noise. There are methods known to largely eliminate this offset. However, switching noise cannot be eliminated in this manner so that particularly in the case of small quantities of light to be measured and the corresponding small electrical signals of the photodiodes and also the short integration times due to the large number of measuring points and thus small measuring signals, in this fashion again practically no reliable signal may be produced for the quantity of light received.

It is therefore an object of the invention to make possible the measurement of small quantities of light and the corresponding small measuring signals of the photodiode, which would permit the reliable measurement of light quantities received by a receiver and in particular a photodiode, even in the presence of such switching noises. This should be possible even with short measuring times, such as those required in the case of high resolutions and the corresponding numerous measuring points of the master to be measured. In addition, the measurements should be independent of previous histories to avoid any falsification of the measured results.

SUMMARY OF INVENTION

Relative to the process, this object is attained in that in a first time segment of the measuring interval a first mean value signal is formed, corresponding to the mean value of the measuring signal (i.e., of the simply integrated signal) over said first time segment, that still within said measuring interval in a second time segment of the same duration as said first time segment, a second mean value signal is formed corresponding to the average of the measuring signal over said second time segment, that a difference signal is formed corresponding to the difference of said two mean value signals and representing a measure of the quantity of light received, and that said difference signal is passed on for further signal processing. The first mean value signal is a measure of the charge quantity generated in the first time segment of the measuring interval in the photodiode, the second mean value signal a measure of the charge quantity generated in the second time segment in the photodiode. The difference signal thus corresponds to a charge quantity difference appearing within a defined period of time and therefore to a current that is proportional to the quantity of light received. The existing noise of the photodiode and of the amplifier (OpAmp) is reduced by the integration over a time segment and the subsequent subtraction during the difference formation of the mean signal values. The switching noise is reduced by the difference formation of the mean value signals.

In an advantageous embodiment of the process each of the first and second mean value signals are formed by integrating the measuring signal.

This may be carried out conveniently in that in the first time segment of the measuring interval, the measuring signal is initially inverted and then integrated, that between the end of the first time segment and the start of the second time segment the mean value signal formed in this manner is maintained, and that in the second time segment of the measuring interval the measuring signal is integrated onto the mean value signal held, without prior inversion.

It may, however, also be effected that in the first time segment of the measuring interval the measuring signal is integrated, that between the end of the first time segment and the beginning of the second time segment the mean value signal formed in this manner is maintained and that in the second time segment of the measuring interval the measuring signal is first inverted and then integrated onto the mean value signal being held.

In an alternate embodiment of the process, the difference signal formed is conducted during the measuring interval to a holding element wherein the difference signal is held separately, until in the subsequent measuring interval a new difference signal is passed to the holding element.

In order to be able to process the difference signal simply and reliably, it is first digitized and then passed on for further signal processing.

An exemplary embodiment of an apparatus includes means which in the first time segment of the measuring interval produce a mean value signal corresponding to the mean value of the measuring signal over the first time segment, means which is the same measuring interval during a second time segment of the same duration as the first time segment produce the mean value over the second time segment, means which produce a difference signal corresponding to the difference of said two mean value signals and representing a measure of the quantity of light received, and a signal processing unit to pass on the difference signal for further processing. The first mean value signal is a measure of the quantity of charge produced during the first time segment of the measuring interval in the photodiode, the second mean value signal is a measure of the quantity of charge produced during the second time segment in the photodiode. The difference signal thus corresponds to a charge quantity difference occurring within a defined time period and which therefore is proportional to a current proportional to the quantity of light received. The existing noise of the photodiode and the amplifier (OpAmp) is reduced by the integration over a time segment and the switching noise is reduced by the subsequent subtraction in the formation of the difference of the mean value signals.

In an advantageous embodiment of the apparatus, a defined initial state of the integrator is obtained independent of previous histories. The integrator circuit, which during a measuring interval produces the measuring signal, comprises a switch which at the beginning of a measuring interval resets the integrator circuit into its initial state. This switch advantageously consists of a MOSFET transistor switch, but just as well may be a JFET transistor switch.

In another advantageous embodiment of the apparatus according to the invention, the means to produce the mean value signal comprise a control, which produces a release signal for the prevailing time segment for a second integrator circuit, which in the prevailing time segment of the measuring interval integrates the measuring signal, thereby producing the corresponding mean value signal.

In a further development of the apparatus, an inverter circuit is provided, which through a switch, actuated by an activating signal produced by the control, may be inserted into the signal path in front of the second integrator circuit producing the mean value signal, as viewed in the direction of the signal flow. This inverter circuit initially inverts the measuring signal following the release signal produced by the control, before the subsequent integrator circuit integrates said measuring signal to produce the first mean value signal. The control produces between the end of the first time segment and the beginning of the second time segment a holding signal for the integrator circuit, so that the latter holds the first mean value signal produced. Following the release signal produced by the control for the second time segment, the subsequent integrator circuit integrates the noninverted measuring signal onto the mean value signal being held. The difference signal of the two mean value signals is thus formed directly.

In another further development of the apparatus an inverter circuit is provided, and inserted into the signal path in front of the second integrator circuit, as viewed in the direction of the flow of signals, which through a switch actuated by an activating signal produced by the control, produces the mean value signal. Following the release signal produced by the control, the integrator circuit integrates the noninverted measuring signal to produce the first mean value signal. The control produces between the end of the first and the beginning of the second time segment a holding signal for the integrator circuit, so that the latter will hold the mean value signal produced. After the activating signal for the inverter circuit and the release signal for the second time segment, the inverter circuit initially inverts the measuring signal, before the subsequent integrator circuit then integrates this inverted signal onto the mean value signal being held. In this manner, the difference signal of the two mean value signals is also formed directly.

In an advantageous further development of the apparatus the switch is provided at the outlet of the inverter circuit. The switch in a first switching position connects this said outlet with the inlet of the subsequent integrator circuit and thus conducts the inverted measuring signal to the inlet of the subsequent integrator circuit. In a second-switching position the switch runs idle and conducts no signal to the inlet of the following integrator circuit and in a third switching position the switch connects the inlet of the inverter circuit with the inlet of the second integrator circuit, thereby conducting the noninverted measuring signal to the inlet of the subsequent integrator circuit.

In an advantageous further development of the apparatus a separate holding element is provided, to the inlet whereof the difference signal is passed by means of a storage signal by the control, still within the measuring interval. This holding element holds the difference signal conducted to its inlet, at its outlet, until in a following measuring interval a new difference signal is passed to its inlet.

In an advantageous further development this holding element consists of a sample-and-hold circuit, provided at its inlet with a switch, which under the control of the storage signal, in a first switching position conducts the difference signal to be held to the sample-and-hold circuit, and in a second switching position, lets the inlet of the sample-and-hold circuit run idle.

In another advantageous embodiment a switch is provided at the outlet of the integrator circuit; it may be actuated by the control and resets, in a first switching position, the integrator circuit into its initial position, runs idle in a second switching position and connects, in a third switching position, the outlet of said integrator circuit with the inlet of the subsequent holding element.

Finally, in another advantageous embodiment of the invention, the difference signal is conducted to the inlet of an analog-digital converter, the outlet whereof is connected with the signal processing unit.

BRIEF DESCRIPTION OF THE DRAWINGS

Other objects and advantages of the present invention will become more apparent from the following detailed description of preferred embodiments when read in conjunction with the accompanying drawings, wherein like elements are represented by like numerals and wherein:

FIG. 2 shows an exemplary embodiment of the first integrator circuit of FIG. 1;

FIG. 3 shows the variation in time of the measuring signal; and

DETAILED DESCRIPTION OF THE PREFERRED EMBODIMENTS

Figure 1:
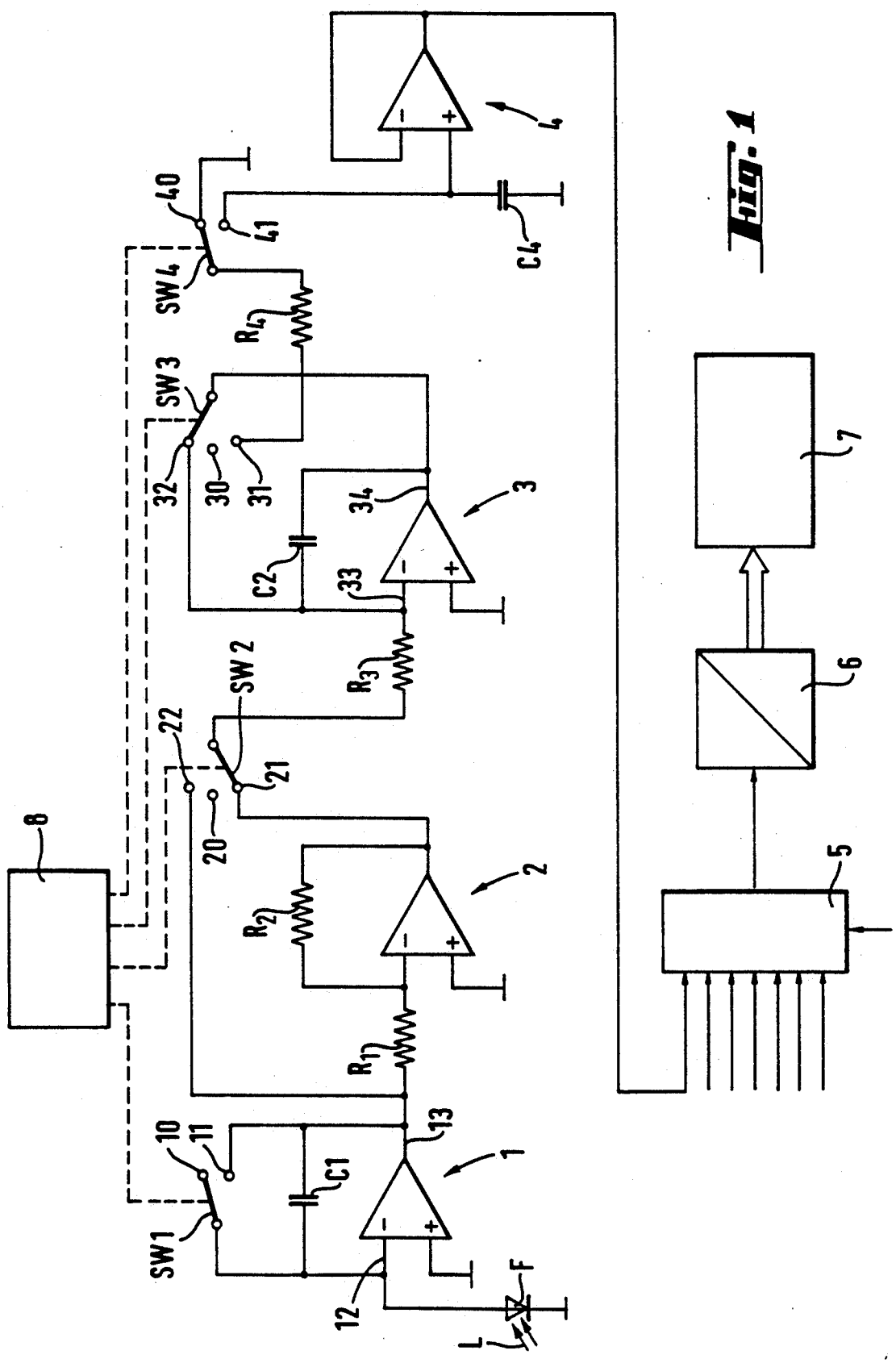
FIG. 1 shows an exemplary embodiment of an apparatus according to the invention.

The mode of operation of the circuit of FIG. 1 is now explained with reference, when needed, to the details of the circuit, such as, for example, the first integrator circuit shown in FIG. 2, and to signal variations and switching positions shown in FIGS. 3 and 4.

FIG. 1 shows an exemplary embodiment of an apparatus according to the invention in the form of a simplified circuit. The circuit comprises a photodiode F, a first integrator circuit 1, an inverter circuit 2, another second integrator circuit 3, a holding element 4, a multiplexer 5, an analog-digital converter 6, a signal processing circuit 7, a plurality of switches SW1, SW2, SW3, SW4, together with a control 8 to actuate said switches.

Prior to the start of each measuring interval the entire circuit layout must be placed into a defined initial state, that is independent of the preceding history and in particular of the effects of the preceding measuring interval. For this, the control 8 emits a control signal to each of the switches SW1 and SW3, which are actuated by said signal. In the following discussion, actuation of a switch by a control signal will be described with the phrase "that the control 8 actuates the switch involved". The control 8 thus actuates the switch SW1 so that it is brought into a position 11 in which the capacitor C1 in the feedback branch is short-circuited. In a similar manner, the control 8 actuates the switch SW3 in a position 32, so that the capacitor C2 is short-circuited in the feedback branch of the integrator circuit 3.

Figure 4:
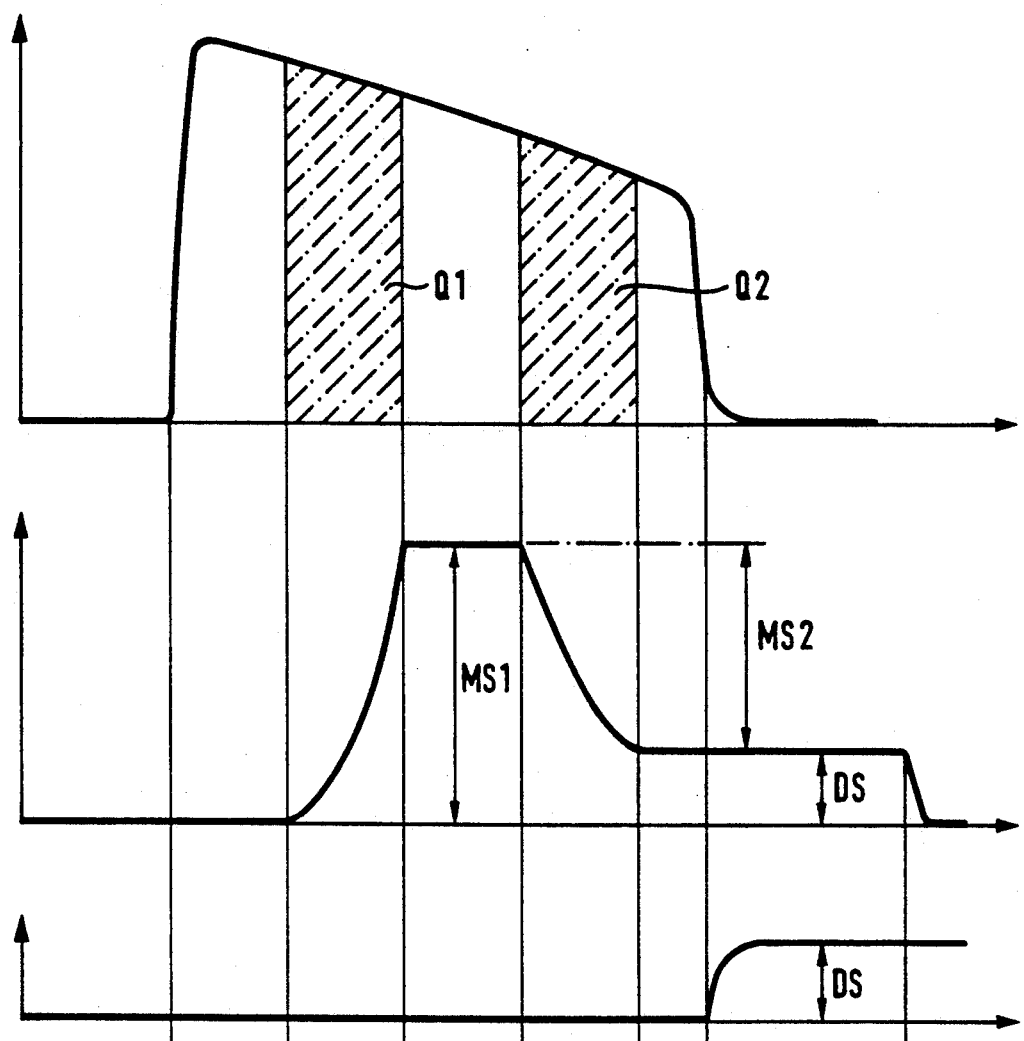
FIG. 4 shows the variation in time of signals according to the circuits and the corresponding switching positions.

The switches SW2 and SW4 are in the switching positions 20 and 40 (switching positions in the table of switching positions, first column, in FIG. 4). These switching positions are displayed in the table of switching positions, which in FIG. 4 are shown under the variation in time of the signal after the first integrator circuit 1, after the second integrator circuit 3 and after the holding element 4, respectively.

Beginning with this initial state, the onset of the measuring signal is triggered when the control 8 actuates the switch SW1 and moves it into switching position 10 (second column of switching positions in FIG. 4). The switch SW1 may consist, as shown in the detailed view of the first integrator circuit in FIG. 2, of a MOSFET transistor switch T1. By means of the release signal at the gate connection of the transistor T1, the short-circuit of the capacitance C1 is eliminated. However, due to the unavoidable gate-drain-capacitance $C_{GD}$ of the transistor T1, this voltage signal causes a charge to flow into the inlet 12 of the operational amplifier Op1, resulting in an offset voltage Of at the outlet 13 of the first integrator circuit, as seen in FIG. 3. The magnitude of this offset voltage Of is not the same in every switching process, so that there is a certain switching noise, indicated by the broken strip N in FIG. 3. The photocurrent produced by the light in the photodiode F (FIG. 2) experiences a signal variation in time, indicated in FIG. 3 by the descending straight line. As the detailed circuit described is an integrator circuit 1, the outlet signal is a measure of the charge produced by light L in the photodiode F.

The variation of the signal in time at the outlet of the integrator circuit during a measuring interval is again shown, on top in FIG. 4. Following the triggering of the measuring interval by the actuation of the switch SW1, the switch SW1 is in the switching position 10, switch SW2 in the switching position 20, switch SW3 in the switching position 32 and switch SW4 in the switching position 40 (second column of the table in FIG. 4).

At the onset of the first time segment of the measuring interval, indicated by the third column in FIG. 4, the control 8 actuates the switch SW2 (activating signal for the inverter circuit 2) and brings it from the switching position 20 into switching position 21 (FIG. 1) so that the outlet signal of the first integrator 1 initially is inverted by the inverter circuit 2 and subsequently bears against the other integrator circuit 3. Simultaneously, the control 8 also actuates the switch SW3 (release signal) and brings it from the switching position 32 into the position 30, whereby the capacitor C2 in the feedback branch of the integrator circuit 3 becomes effective. The integrator circuit 3 thus integrates in this time segment the signal standing at its inlet 33 into a parabolic outlet signal. The variation of the output signal of this additional integrator circuit 3 is shown in the second line of FIG. 4, under the (inverted) outlet signal of the first integrator circuit 1. In the first time segment of the measuring interval, i.e., in the third column of FIG. 4, the parabolic configuration of said outlet signal is shown. This outlet signal is a measure of the area Q1 (FIG. 4). The area Q1 is in turn a measure of the mean value of the output signal of the first integrator circuit 1 over the first time segment, and thus a measure of the mean value of the charge over the first time segment. The end value of the outlet signal of the second integrator circuit 3 over the first time segment of the measuring interval will therefore be referred to hereafter as the first mean value signal MS1.

At the end of this first time segment the control 8 actuates the switch SW2 (holding signal) and moves it from the switching position 21 into the switching position 20, as see in the fourth column of FIG. 4. This is the time period between the first and the second time segment of the measuring interval. In this period of time the integrator 3 holds the mean value signal MS1 produced in the first time segment at its outlet 34. The switches SW1, SW3 and SW4 are in the switching positions 10, 30, and 40.

At the onset of the second time segment of the measuring interval, indicated by the fifth column in FIG. 4, the control 8 again actuates the switch SW2 and moves it from the switching position 20 into the switching position 22 (FIG. 1) so that the outlet signal of the first integrator circuit 1 is standing noninverted at the inlet 33 of the further integrator circuit 3. The integrator circuit 3 thus integrates the signal standing at its inlet 33 onto the mean value signal MS1 being held. The variation in time of the outlet signal of the integrator circuit 3 is shown in the second line of FIG. 4, under the outlet signal of the first integrator circuit 1. In the second time segment of the measuring interval, i.e., the fifth column of FIG. 4, the again parabolic configuration of the outlet signal is seen. The area Q2 is again a measure for the mean value MS2 of the outlet signal of the first integrator circuit 1 over the second time segment and thus a measure of the mean value of the charge over said second time segment. The final value of the outlet signal of the second integrator circuit 3 over the second time segment is a measure of the difference of the two mean value signals MS1 and MS2 and is therefore designated the difference signal DS. This difference signal is also a measure of the difference of two charge quantities in the photodiode F in a defined period of time and thus a measure of the photo current. Simultaneously, by integration over a time segment and the subsequent difference formation the statistically distributed noise, which in both time segments is superposed over the measuring signal, is reduced at least to the extent that good signal-noise distances may be obtained at the outlet 35 of the integrator circuit 3, so that the safe further processing of the difference signal DS is possible.

Following the completion of the second time segment of the measuring interval, i.e., in the sixth column of FIG. 4, the control 8 returns the switch SW2 into position 20, while the switches SW1, SW3 and SW4 remain in the switching positions 10, 30 and 40. The difference signal DS is thus standing at the outlet 34 of the integrator circuit 3.

In order to conduct this difference signal DS to the holding element 4 in the form of a sample-and-hold circuit, the control 8 subsequently actuates the switches SW3 and SW4 (storage signal) and moves them into the positions 31 and 41. This may be seen in the seventh column of FIG. 4 and in the variation in time of the outlet signal of the holding element 4 (third line of FIG. 4, seventh column). By actuating the switch SW4, the difference signal is conducted to the inlet capacitor C4 of the sample-and-hold circuit 4. Simultaneously, the control 8 also actuates the switch SW1 and shorts the integrator capacitor C1 of the first integrator circuit 1.

Following the passing of the difference signal DS to the sample-and-hold circuit 4, the integration capacitor of the integrator circuit 3 is shorted by the actuation of the switch SW3, i.e., the switch SW3 is moved into the switching position 32. This is seen in the eighth and last column of FIG. 4. The entire circuit layout is then again in the initial state, as described at the beginning of the description of the operation of the layout, i.e., the switches SW1, SW2, SW3 and SW4 are again in the positions 11, 20, 32 and 34, as in the first column of FIG. 4.

The difference signal is standing at the outlet of the sample-and-hold circuit 4, until a new difference signal is conducted to the circuit 4. The signal standing at the outlet of the multiplexer 5 is conducted to the inlet of the analog-digital converter 6, which digitizes the analog difference signal. The outlet of the analog-digital converter 6 is connected with the signal processing unit 7, which further processes the digitized signal.

In a practical embodiment of the circuit, a photodiode, for example a photodiode or a photodiode array of the Type S2319-35Q of the Hamamatsu Co. may be used. As operational amplifiers, for example amplifiers of Type TL 074 of the Texas Instruments Co. may be used for the inverter circuit 2 and the integrator circuit 3, while for the first integrator circuit 1, for example, an operational amplifier Type LF 356 of the National Semiconductor Co. is especially suitable. The capacitors may be dimensioned, for example, $C1 = 2.2pF$, $C2 = 1.5nF$ and $C4 = 1.5nF$ and the individual resistances $R_1$ and $R_2$ of the inverter circuit 2 may amount, for example, to 10 k$\Omega$. The preresistance $R_3$ at the inlet of the integrator circuit 3 may amount for example to 3.6 k$\Omega$ while the resistance $R_4$ at the inlet of the sample-and-hold circuit 4 may be chosen at 100 $\Omega$. For the multiplexer and the analog-digital converter, known commercial modules may be used.

As a variant of the circuit described above it is, for example, conceivable to provide for the production of each of the first mean value signal and the second mean value signal a separate signal branch with a separate integrator circuit, which integrates the measuring signal in the time segment involved. In one of these branches the integrator circuit may be preceded or followed by an inverter circuit, so that one of the mean value signals is inverted. Subsequently, both signals are inverted. Obviously, both signals may be inverted or not inverted, whereupon the difference of the two signals may be formed. As a further variant of the mode of operation described above of the circuit layout, instead of inverting the measuring signal in the first time segment and not inverting it in the second time segment, it may be inverted in the second and not inverted in the first time segment. Such circuit layouts are particularly suitable for use in connection with spectrophotometers in which, for example, very small light signals may occur, so that subsequently only a very brief period of time is available for the measurement. Such requirements derive from the high resolution of the master desired, i.e., a high number of measuring points, which must be measured within the shortest time possible (for example within a few $\mu$s). These requirements are satisfied by the present invention and correspondingly small quantities of light may be processed.

It will be appreciated by those skilled in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description and all changes which come within the meaning and range of equivalents thereof are intended to be embraced therein.

What is claimed is:

1. Process for the measurement of small quantities of light, whereby the light quantity to be measured is received and converted into an electrical signal that is integrated during a measuring interval into a measuring signal, comprising the steps of forming a first mean value signal in a first time segment of the measuring interval, said first mean value signal corresponding to a mean value of the measuring signal over said first time segment; forming a second mean value signal in a second time segment of a same duration as said first time segment of said measuring interval corresponding to a mean value of the measuring signal over said second time segment; forming a difference signal corresponding to a difference of said first and second mean value signals as a measure of a quantity of light; and passing this difference signal on to further signal processing.

2. Process according to claim 1, wherein each of said first and said second mean value signals are formed by integrating the measuring signal.

3. Process according to claim 2, wherein said step of forming said first mean value signal further includes steps of: inverting and then integrating the measuring signal in said first time segment of the measuring interval and holding said first mean value signal between the end of the first time segment and the beginning of the second time segment; and said step of forming said second mean value signal further includes a step of integrating said measuring signal in the second time segment of the measuring interval, without prior inversion, onto the first mean value signal being held.

4. Process according to claim 2, wherein said measuring signal is integrated in said first time segment of the measuring interval, wherein further the thus formed first mean value signal is held between the end of the first time segment and the beginning of the second time segment, and wherein in the second time segment the measuring signal is initially inverted and then integrated onto the first mean value signal being held.

5. Process according to claim 2, wherein the difference signal is digitized and then passed on for further signal processing.

6. Process according to claim 1, further comprising a step of conducting the difference signal formed to a holding element wherein the difference signal is held separately until in a following measuring interval a new difference signal is passed to the holding element.

7. Apparatus for measuring small quantities of light comprising: a light receiver which converts light received into an electrical signal; a first integrator circuit which integrates the electrical signal during a measuring interval into a measuring signal; means for producing, in a first time segment of the measuring interval, a first mean value signal corresponding to a mean value of the measuring signal over said first time segment; means for producing a second mean value signal in a second time segment of the measuring interval, said second time segment being of a same duration as said first time segment and said second mean value signal corresponding to a mean value of the measuring signal over said second time segment; means for producing a difference signal corresponding to a difference of the first and second mean value signals and representing a measure of a quantity of light received; and a signal processing unit to which the difference signal is passed for further processing.

8. Apparatus according to claim 7, wherein said first integrated circuit which produces the measuring signal during a measuring interval comprises a switch, which at the beginning of a measuring interval resets the first integrator circuit into its initial state.

9. Apparatus according to claim 8, wherein said switch comprises a MOSFET transistor switch.

10. Apparatus according to claim 7, wherein said means for producing the first and second mean value signals further comprise a second integrator circuit, and a control which for a prevailing time segment produces a release signal for the second integrator circuit such that in said prevailing time segment of the measuring interval said second integrator circuit integrates the measuring signal to produce the first and second mean value signals.

11. Apparatus according to claim 10, further comprising: an inverter circuit actuated by an activating signal produced by the control through a switch and inserted into a signal path in front of the second integrator circuit producing the first and second mean value signals as viewed in the direction of signal flow such that said inverter circuit, following the release signal produced by the control for the first time segment, initially inverts the measuring signal before the second integrator circuit integrates the inverted measuring signal in order to produce the first mean value signal, said control producing a holding signal for the second integrator circuit between an end of the first time segment and a beginning of the second time segment so that the second integrator circuit holds the first mean value signal and, following the release signal produced by the control for the second time segment, said second integrator circuit integrating the noninverted measuring signal onto the first mean value signal being held.

12. Apparatus according to claim 10, further comprising: an inverter circuit actuated by an activating signal produced by the control through a switch and inserted into a signal path in front of the second integrator circuit producing the first and second mean value signals as viewed in the direction of signal flow such that following the release signal produced by the control the second integrator circuit integrates the noninverted measuring signal to produce the first mean value signal, the control further producing a holding signal for the second integrator circuit between the end of the first time segment and the beginning of the second time segment so that the second integrator circuit holds the first mean value signal and, following the activating signal produced by the control for the activation of the inverter circuit and the release signal for the second time segment, the inverter circuit inverting the measuring signal before integrating it onto the first mean value signal being held.

13. Apparatus according to claim 11, wherein the switch is provided at an outlet of the inverter circuit and the switch, in a first switching position, connects said outlet with an inlet of the second integrator circuit to conduct an inverted measuring signal to the inlet of the second integrator circuit, in a second switching position the switch runs idle and conducts no signal to the inlet of the second integrator circuit, and in a third switching position the switch connects the inlet of the inverter circuit with the inlet of the second integrator circuit to conduct the noninverted measuring signal to the inlet of the second integrator circuit.

14. Apparatus according to claim 12, wherein the switch is provided at an outlet of the inverter circuit and the switch, in a first switching position, connects said outlet with an inlet of the second integrator circuit to conduct an inverted measuring signal to the inlet of the second integrator circuit, in a second switching position the switch runs idle and conducts no signal to the inlet of the second integrator circuit, and in a third switching position the switch connects the inlet of the inverter circuit with the inlet of the second integrator circuit to conduct the noninverted signal to the inlet of the second integrator circuit.

15. Apparatus according to claim 10, further comprising: a separate holding element, to the inlet whereof the difference signal is conducted by means of a storage signal produced by the control for the measuring interval, said holding element holding the difference signal conducted to its inlet until, in a following measuring interval, a new difference signal is passed to its inlet.

16. Apparatus according to claim 15, wherein the holding element further comprises: a sample-and-hold circuit, provided at its inlet with a switch, which under the control of the storage signal, in a first switching position conducts the difference signal to be held to the sample-and-hold circuit, and in a second switching position lets the inlet of the sample-and-hold circuit run idle.

17. Apparatus according to claim 15, wherein at an outlet of the second integrator circuit a switch is provided, said switch being actuated by the control and in a first switching position resetting said second integrator circuit into its initial position, idling said second integrator circuit in a second switching position, and in a third switching position connecting the outlet of said second integrator circuit with the inlet of the holding element.

18. Apparatus according to claim 17, further comprising an analog-digital converter for receiving at an inlet the difference signal, an outlet of said analog-digital converter being connected with the signal processing unit.

* * * * *